United States Patent [19]

Kuroki

[11] Patent Number: 4,540,945

[45] Date of Patent: Sep. 10, 1985

[54] VARIABLE-FREQUENCY OSCILLATION CIRCUIT

[75] Inventor: Kazuo Kuroki, Tokyo, Japan

[73] Assignee: Fuji Electric Co., Ltd., Kawasaki, Japan

[21] Appl. No.: 413,720

[22] Filed: Sep. 1, 1982

[30] Foreign Application Priority Data

Sep. 3, 1981 [JP] Japan .................. 56-139110

[51] Int. Cl.³ .................. H03K 3/72; H03L 7/18
[52] U.S. Cl. .................. 328/134; 307/271;
307/526; 307/529; 328/63; 331/48
[58] Field of Search ............. 307/525, 526, 527, 529,
307/271; 328/15, 16, 19, 58, 63, 133, 134;
331/46, 48

[56] References Cited

U.S. PATENT DOCUMENTS

| | | | |
|---|---|---|---|
| 3,866,129 | 2/1975 | Cornelissen | 307/271 X |
| 3,870,900 | 3/1975 | Malaviya | 307/527 X |
| 3,943,454 | 3/1976 | Getgen | 328/133 |
| 4,344,046 | 8/1982 | Zumsteg | 331/46 X |

*Primary Examiner*—Stanley D. Miller
*Assistant Examiner*—D. R. Hudspeth
*Attorney, Agent, or Firm*—Brumbaugh, Graves, Donohue & Raymond

[57] ABSTRACT

A highly stable, tunable oscillator circuit includes a crystal oscillator providing a reference pulse signal of frequency fcry, a voltage-to-frequency converter responsive to a control voltage vc for providing a control pulse signal of frequency fv substantially lower than fcry, and a flip-flop circuit receiving the reference and control signals and providing a negative going pulse signal synchronized with the reference signal and having a frequency fv and a pulse width equal to 1/fcry. The signal provided by the flip-flop circuit and the complement of the reference signal are received by a NAND gate which periodically removes a pulse from the reference signal at intervals of 1/fv and provides a resulting signal having a frequency of (fcry)²/(fcry+fv). The resulting signal is received by a frequency divider network which divides the frequency of resulting signal by an integer N and provides an output signal of a desired frequency. The output frequency is tunable by varying the frequency fv of the control signal by means of the control voltage vc. By selecting the frequencies of the reference and control signals such that fcry>>fv, a highly stable and smoothly tunable output signal is obtained.

1 Claim, 3 Drawing Figures

VARIABLE-FREQUENCY OSCILLATION CIRCUIT

BACKGROUND OF THE INVENTION

The present invention relates to a variable-frequency oscillation system for determining an output frequency of a power converter apparatus employing inverters.

In a case where inverters are operated in synchronization with a commercial power source or where a plurality of inverters are operated in parallel relative to a commercial power source, it is required to use an oscillator having a frequency variable function capable of detecting the phase difference between the power source and the inverters and controlling the frequency for about several %.

As satisfying such requirement, a variable-frequency oscillator using a crystal oscillator has been known and a prior art example is described referring to FIG. 1 for an understanding of this invention.

FIG. 1 is a circuit diagram in block form showing the prior art example wherein the output of a crystal oscillator 11 is introduced by way of a F/V converter (frequency-voltage converter) 12 to an adder 13. A control voltage is also applied by way of another path to the adder 13 and the output from the adder 13 is branched into a portion to be introduced by way of a PI controller (proportional integration type controller) 14 to a V/F converter (voltage-frequency converter) 15, the output signal of which is taken out by way of a frequency divider 17 as an output frequency and into another portion to be fed back by way of a F/V converter 16 to the adder 13.

Referring now to the operation, clock pulses of frequency fcry from the crystal oscillator 11 are converted in the F/V converter 12 into a signal Vcry and introduced into the adder 13. While on the other hand, a control voltage Vc is applied to the adder 13 and the sum of the input value Vcry and the control voltage Vc form a setting value for determining the output frequency.

The output from the adder 13 is converted by way of the PI converter 14 and the V/F converter 15 into an output signal $N \times fo$, a portion of which is converted by way of the frequency divider 17 into an output signal f0 at 1/N frequency and the other portion of which is converted by way of the F/V converter 16 into a voltage $V_N \times fo$ and fed back to the adder 13.

Accordingly, the output from the adder 13 is the difference between Vc+Vcry and $V_N \times fo$ and, by controlling this difference to zero in the PI controller 14, the output frequency $N \times fo$ from the V/F converter 15 is a frequency that is determined by fcry and the control voltage Vc, provided that the gain and the linearity are the same for the V/F converter 15 and the F/V converter 16.

Since the accuracy for the final output frequency fo is determined by the accuracy of the F/V converters 12, 16 in the prior example, it is required for the converters 12, 16 that they have the same gain and the linearity and are highly accurate and stable. Particularly, in a case of a CVCF inverter (constant voltage constant frequency inverter), since very high accuracy is demanded for the output frequency, it is required to restrict the fluctuations including temperature changes, aging changes and the likes to less than 0.1%, whereby higher accuracy and stability are required for the F/V converters.

However, since F/V converter is generally composed by using resistors, capacitors, diodes, differential amplifiers and the likes, circuit structure is complicated very much and a lot of controlling sections are required as well, in order to satisfy the foregoing performances.

This results in drawbacks of impairing the reliability and the stability, making the entire apparatus larger and increasing the cost thereof.

In addition, since the output frequency $N \times fo$ from the V/F converter is generally used while divided into a lower frequency by the frequency divider, a V/F converter operated at a frequency as high as several MHz is required for the digital control or the like, thereby making the converter itself very much expensive.

SUMMARY OF THE INVENTION

The object of this invention is overcome the foregoing disadvantages and provide a variable-frequency oscillation system which is highly reliable with high accuracy and high stability and can be constituted with a small-sized and low cost apparatus.

According to this invention, the foregoing object can be attained by a variable-frequency oscillation circuit employing a reference oscillator such as a crystal oscillator, wherein the frequency fv of output pulses generated by a voltage-frequency converter for applying a control voltage is selected so as to be sufficiently lower than the frequency fcry of output pulses from the reference oscillator, both of the output pulses are supplied to a logic circuit to remove fv pulses from fcry output pulses from the reference oscillator which are produced during a unit interval of time, and the number of pulses to be removed is changed for the variation of frequency.

Figure 1:
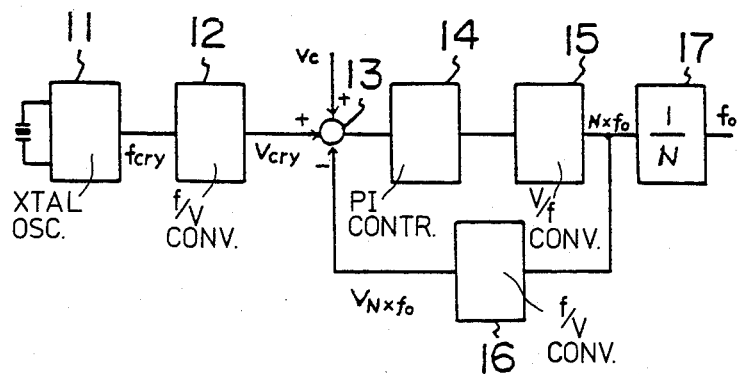
FIG. 1 is a block diagram of a known variable-frequency oscillator circuit.

This invention will be explained more in detail by way of its embodiment referring to the drawings.

Figure 2:
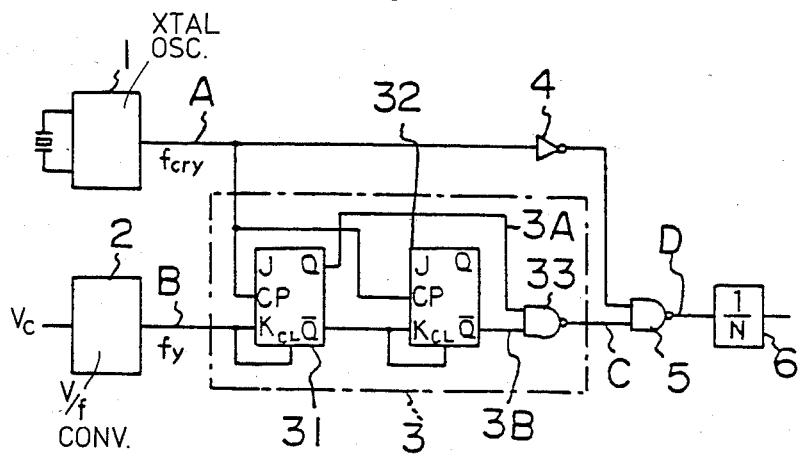
FIG. 2 is a block and logic diagram of a variable-frequency oscillator circuit according to an embodiment of the present invention.

FIG. 2 is a circuit diagram showing one embodiment of this invention, wherein a reference oscillator 1 such as a crystal oscillator and a V/F converter 2 applied with a control voltage are provided and the output from the reference oscillator 1 is inputted as a clock signal to a logic circuit 3 composed of a J-K flip-flops 31, 32 and a NAND gate 33, and the output signal from the reference oscillator 1 is also introduced by way of an inverter gate 4 to one input of a NAND gate 5.

The output from the V/F converter is introduced to the logic circuit 3.

The output signal from the logic circuit 3 is introduced to the other input of the NAND gate 5, and the output signal from the NAND gate 5 is introduced into a frequency divider 6, from which an output frequency is taken out.

Referring then to the operation, it is assumed here that the output frequency from the reference oscillator 1 is fcry and the center frequency of the V/F converter 2 (a frequency determined by the control voltage Vc where the control voltage Vc is changed for $\pm \Delta Vc$ and the output frequency fo is changed for required variable frequency $\pm \Delta fo$) is fv, and that fv is selected sufficiently lower as compared with fcry.

Figure 3:
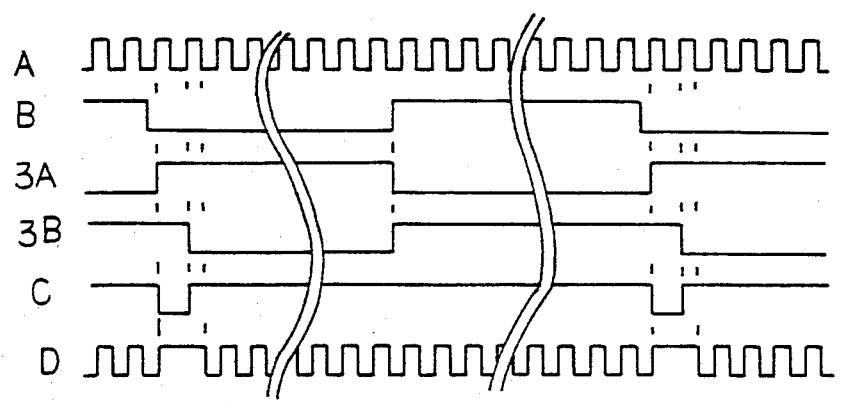

In this case, as shown by the operation waveform chart in FIG. 3, the clock output signal A from the reference oscillator 1 and the output signal B from the V/F converter 2 are introduced into the J-K flip-flop 31 in the logic circuit 3, where the signal B is shaped into an inverted signal 3A by synchronizing the falling point of the signal B with the rising point of the signal A. Further, in the J-K flip-flop 32, the signal 3A is delayed with respect to its rising point by one cycle of the signal A and inverted into an inverted signal 3B. The signals A and B are formed into a signal C by passing through the NAND gate 33.

The signal C and the output signal A of the reference oscillator 1 which is inverted by passing through the inverter gate 4 are introduced into the NAND gate 5, where fv pulses are removed from pulses fcry in the output signal A generated during a unit interval of time to produce an output signal D, which is introduced into the frequency divider 6 and divided into an output signal fo.

Since the frequency divider 6 is composed of a circuit using the J-K flip-flops and the likes, the signal D is used directly as the clock signals in the control circuit.

In the case of using the system according to this invention, the relation for each of the frequencies is described as:

$$fo = \frac{1}{N} \times \frac{(fcry)^2}{fcry + fv}$$

and the output frequency is varied by the unit of 1/fcry sec by varying the output frequency fv of the V/F converter. In the case of a CVCF inverter (constant voltage constant frequency inverter), since the frequency $$\frac{(fcry)^2}{fcry + fv}$$

of the signal D is generally higher sufficiently than the output frequency fo (50 Hz or 60 Hz) and each of the frequencies can be selected under the condition of: fcry>>fv, the output frequency can be varied smoothly.

The accuracy for the output frequency is expressed as the accuracy of $$V/F \text{ converter} \times \frac{fv(fcry + fv)}{(fcry)^2}$$

provided that the consideration for the accuracy of the reference oscillator 1 such as a crystal oscillator is negligible.

Accordingly, in a case where output frequency fo=50 Hz, variable range=±2% and N=2⁸×96, for instance, since it is only required that the variable range for the output frequency of the V/F converter is greater than ±24.6 KHz, if the output frequency fcry from the reference oscillator 1 is selected to 1.3 MHz, the center frequency fv for the V/F converter 2 is 75.3 KHz and the accuracy for the output frequency can be set as: accuracy for the V/F converter×0.061.

As described above, in the variable-frequency oscillation system according to this invention, since variable output frequency can be obtained by selecting the output frequency fv from the V/F converter sufficiently lower than the output frequency fcry from the reference oscillator, preparing $$\frac{(fcry)^2}{fcry + fv}$$

by a simple digital logic circuit and frequency dividing the same, the accuracy for the output frequency can readily be improved without using highly accurate V/F converter, and V/F converter of a relatively lower frequency can be used even in a digital circuit of a high frequency, whereby the cost for the apparatus can be reduced.

In addition, since the output frequency is determined by $$\frac{1}{N} \times \frac{(fcry)^2}{fcry + fv},$$

errors in the output frequency from the reference oscillator can be absorbed easily by merely providing the V/F converter with the controlling function for the center frequency, a low cost reference oscillator can be used and it is only required for controlling the center frequency of the V/F converter, which renders the operation highly stable.

Further, since all of the components except for the V/F converters are composed as a digital circuit, they are highly stable without undergoing undersirable effects such as temperature changes and aging changes and the entire apparatus can be constituted with less number of parts, in a small size and at a low cost.

I claim:

1. A variable-frequency oscillator circuit comprising:
   (a) a reference oscillator providing a reference pulse signal at a frequency fc;
   (b) voltage-to-frequency converter means responsive to a control voltage for providing a control pulse signal at a frequency fv substantially lower than fc;
   (c) first logic means responsive to the reference signal and the control signal for providing a first pulse signal having a frequency substantially equal to fv and a pulse width substantially equal to 1/fc and synchronized with the reference signal, the first logic means comprising first and second J-K flip-flops each having a clock input, J and K logic inputs, an asynchronous clear input, a nominal output and an inverted output, and a first two-input NAND gate, the clock inputs of the first and second flip-flops being connected to the reference oscillator for receiving the reference signal therefrom, the K and clear inputs of the first flip-flop being connected to the voltage-to-frequency converter means for receiving the control signal therefrom, the K and clear inputs of the second flip-flop being connected to the inverted output of the first flip-flop, the J inputs of the first and second flip-flops being operatively maintained at a "1" logic state, the first two-input NAND gate being connected to receive the nominal output of the first flip-flop and the inverted output of the second flip-flop and providing the first pulse signal;
   (d) second logic means responsive to the reference signal and the first signal for providing a second pulse signal which is substantially the same as the reference signal but with a pulse periodically removed at intervals of 1/fv, the second logic means comprising a second two-input NAND gate and an inverter, the second NAND gate being connected to the reference oscillator through the inverter for receiving the inverted reference signal and to the first NAND gate for receiving the first signal, and providing the second signal; and (e) frequency divider means responsive to the second signal for dividing the frequency of the second signal by an integral amount to provide an output signal of a desired frequency.

* * * * *